United States Patent
Li et al.

(10) Patent No.: US 11,483,939 B2
(45) Date of Patent: Oct. 25, 2022

(54) ELECTRONIC DEVICE WITH DISPLAY INTERFACE

(71) Applicant: Delta Electronics, Inc., Taoyuan (TW)

(72) Inventors: You-Lin Li, Taoyuan (TW); Chun-Hsien Yu, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 0 days.

(21) Appl. No.: 17/207,115

(22) Filed: Mar. 19, 2021

(65) Prior Publication Data
US 2022/0046812 A1 Feb. 10, 2022

(30) Foreign Application Priority Data

Aug. 5, 2020 (CN) .......................... 202010776035.X

(51) Int. Cl.
*H05K 5/02* (2006.01)
*H05K 5/00* (2006.01)

(52) U.S. Cl.
CPC ......... *H05K 5/0204* (2013.01); *H05K 5/0017* (2013.01)

(58) Field of Classification Search
CPC ............................ H05K 5/0204; H05K 5/0017
See application file for complete search history.

(56) References Cited

U.S. PATENT DOCUMENTS

| | | | | |
|---|---|---|---|---|
| 5,708,561 A * | 1/1998 | Huilgol | ................. | G06F 1/1688 361/679.55 |
| 5,923,528 A * | 7/1999 | Lee | ....................... | G06F 1/1601 248/921 |
| 6,189,850 B1 * | 2/2001 | Liao | .......................... | G06F 1/16 248/920 |
| 6,522,529 B1 * | 2/2003 | Huilgol | ................. | G06F 1/1683 361/679.06 |
| 6,639,788 B1 * | 10/2003 | Liao | ....................... | G06F 1/1601 361/679.22 |
| 7,082,028 B2 * | 7/2006 | Huilgol | ................. | G06F 1/1637 248/125.1 |
| 8,611,074 B2 * | 12/2013 | Hari | ..................... | H05K 5/0017 340/854.3 |

(Continued)

FOREIGN PATENT DOCUMENTS

| | | | |
|---|---|---|---|
| CN | 1728928 A | | 2/2006 |
| CN | 103200794 A | * | 7/2013 |
| CN | 103200794 B | * | 4/2016 |

OTHER PUBLICATIONS

Office Action and Search Report of its corresponding TW application No. 109126442 dated May 7, 2021.

(Continued)

*Primary Examiner* — Abhishek M Rathod
*Assistant Examiner* — Keith DePew
(74) *Attorney, Agent, or Firm* — Muncy, Geissler, Olds & Lowe P.C.

(57) ABSTRACT

An electronic device with a display interface is provided. The electronic device includes a device body and a display module. The device body includes a groove. The display module is disposed on the device body, wherein the display module includes a shaft, the shaft is rotatably connected to the groove and is adapted to be slid in the groove, and the extension direction of the groove differs from the axis of the shaft.

7 Claims, 10 Drawing Sheets

(56) References Cited

U.S. PATENT DOCUMENTS

| | | | | |
|---|---|---|---|---|
| 8,693,188 | B2* | 4/2014 | Holman, IV | H04M 1/0237 |
| | | | | 361/679.55 |
| 8,811,034 | B2* | 8/2014 | Lee | G06F 1/1616 |
| | | | | 361/755 |
| 9,304,541 | B2* | 4/2016 | Chuang | G06F 1/1622 |
| 10,936,018 | B2* | 3/2021 | Kao | G06F 1/1626 |
| 11,278,288 | B2* | 3/2022 | Rector | A61B 17/07207 |
| 2005/0104847 | A1* | 5/2005 | Tanaka | H04M 1/0247 |
| | | | | 345/156 |
| 2005/0105252 | A1* | 5/2005 | Tanaka | H04M 1/0237 |
| | | | | 361/679.21 |
| 2005/0105258 | A1* | 5/2005 | Tanaka | H04M 1/0227 |
| | | | | 361/679.27 |
| 2006/0007644 | A1* | 1/2006 | Huilgol | G06F 1/1616 |
| | | | | 248/917 |
| 2009/0000343 | A1* | 1/2009 | Giacomin | A45C 11/327 |
| | | | | 70/456 R |
| 2011/0237099 | A1* | 9/2011 | Ni | G06K 19/07732 |
| | | | | 439/142 |
| 2013/0033801 | A1* | 2/2013 | Hari | H05K 5/0017 |
| | | | | 361/679.01 |

OTHER PUBLICATIONS

The Extended Search Report of its corresponding EP application No. 21185343.7 dated Feb. 17, 2022.

* cited by examiner

ELECTRONIC DEVICE WITH DISPLAY INTERFACE

CROSS REFERENCE TO RELATED APPLICATIONS

This application claims priority of China Patent Application No. 202010776035.X, filed on Aug. 5, 2020, the entirety of which is incorporated by reference herein.

BACKGROUND OF THE INVENTION

Field of the Invention

The present invention relates to an electronic device, and in particular to an electronic device with a display interface.

Description of the Related Art

A conventional uninterruptible power system has a display module. The display module shows power-capacitance information and voltage information. Commonly, the display module is affixed to the uninterruptible power system. When the orientation of the uninterruptible power system is changed (for example, changed from the standing state to a lying state), the orientation of the display module changes (for example, it changes by 90 degrees), and it is inconvenient for the user to read the power-capacitance information and the voltage information.

Conventionally, to allow the display module to rotate relative to the uninterruptible power system, a complex pivoting mechanism is provided. The conventional pivoting mechanism takes up space inside the uninterruptible power system, and needs a longer cable to connect the display module with the mainboard of the uninterruptible power system.

BRIEF SUMMARY OF THE INVENTION

Embodiments of the invention are provided to address the aforementioned difficulty.

In one embodiment, an electronic device with a display interface is provided. The electronic device includes a device body and a display module. The device body includes a groove. The display module is disposed on the device body, wherein the display module comprises a shaft, the shaft is rotatably connected to the groove and is adapted to be slid in the groove, and the extension direction of the groove differs from the axis of the shaft.

In one embodiment, the extension direction of the groove is perpendicular to the axis of the shaft.

In one embodiment, the shaft is slid between a first groove portion and a second groove position inside the groove, and when the shaft is in the first groove position, the orientation of the display module relative to the device body is restricted, and when the shaft is in the second groove position, the display module is adapted to be rotated relative to the device body.

In one embodiment, the device body comprises a cover, the groove is formed on the cover, the cover comprises a first cover wall, and when the shaft is in the first groove position, the first cover wall abuts the display module, and when the shaft is in the second groove portion, the first cover wall is separated from the display module.

In one embodiment, the cover comprises a receiving portion, the receiving portion is located in a corner of the cover, a groove is formed in the receiving portion, and when the shaft is in the first groove position, the display module is sufficiently located in the receiving portion, and when the shaft is in the second groove position, at least a portion of the display module is located outside the receiving portion.

In one embodiment, the cover further comprises a second cover wall, the second cover wall is perpendicular to the first cover wall, a wall notch is formed on the second cover wall, and the wall notch corresponds to one side of the display module.

In one embodiment, the shaft is adapted to abut the inner wall of the groove.

In one embodiment, the shaft comprises a shaft restriction slot, the shaft restriction slot comprises a first stopping wall and a second stopping wall, the device body comprises a device stopping protrusion, and when the shaft is in the second groove position, the device stopping protrusion is inserted into the shaft restriction slot, and when the shaft is in the second groove position and the display module is in the first module orientation, the device stopping protrusion abuts the first stopping wall, and when the shaft is in the second groove position and the display module is in the second module orientation, the device stopping protrusion abuts the second stopping wall.

In one embodiment, the display module comprises a module body, the shaft is connected to the module body, the module body comprises at least one module wedging portion, the device body comprises at least one device wedging portion, and when the shaft is in the first groove position in the groove, the module wedging portion is wedged into the device wedging portion, and when the shaft is in the second groove position in the groove, the module wedging portion is separated from the device wedging portion.

In one embodiment, the device wedging portion comprises a wedging arm, and the extension direction of the wedging arm is parallel to the extension direction of the groove.

In one embodiment, the device body comprises a plurality of device wedging portions, and the device wedging portions are disposed on both sides of the groove.

In one embodiment, the shaft comprises a first shaft stopping protrusion, the device body comprises a device restriction slot, the device restriction slot comprises a third stopping wall and a fourth stopping wall, and when the shaft is in the second groove position, the first shaft stopping protrusion is inserted into the device restriction slot, and when the shaft is in the second groove position, and the display module is in the first module orientation, the first shaft stopping protrusion abuts the third stopping wall, and when the shaft is in the second groove position, and the display module is in the second module orientation, the first shaft stopping protrusion abuts the fourth stopping wall.

In one embodiment, the shaft comprises a plurality of flexible fasteners, the flexible fasteners are arranged in an annular manner, the flexible fasteners are wedged into the device body, the groove comprises a first groove area, a second groove area and a waist area, the waist area is located between the first groove area and the second groove area, the width of the waist area is smaller than the width of the first groove area, the width of the waist area is smaller than the width of the second groove area, and when the shaft is in the first groove position, the shaft is in the first groove area, and when the shaft is in the second groove position, the shaft is in the second groove area.

In one embodiment, the device body comprises at least one restriction slot, the shaft comprises a second shaft stopping protrusion, and when the shaft is in the first groove position, the second shaft stopping protrusion wedges one of the restriction slots to restrict the orientation of the display module.

In one embodiment, the display module shows the power-capacitance information and voltage information.

Utilizing the electronic device of the embodiment of the invention, the display module can be rotated relative to the device body. The shaft of the embodiment of the invention has simpler structure and occupies smaller space. The display module is coupled to a mainboard of the electronic device via a cable. The length of the cable can be reduced, and the cable is prevented from being unexpectedly detached from the display module.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
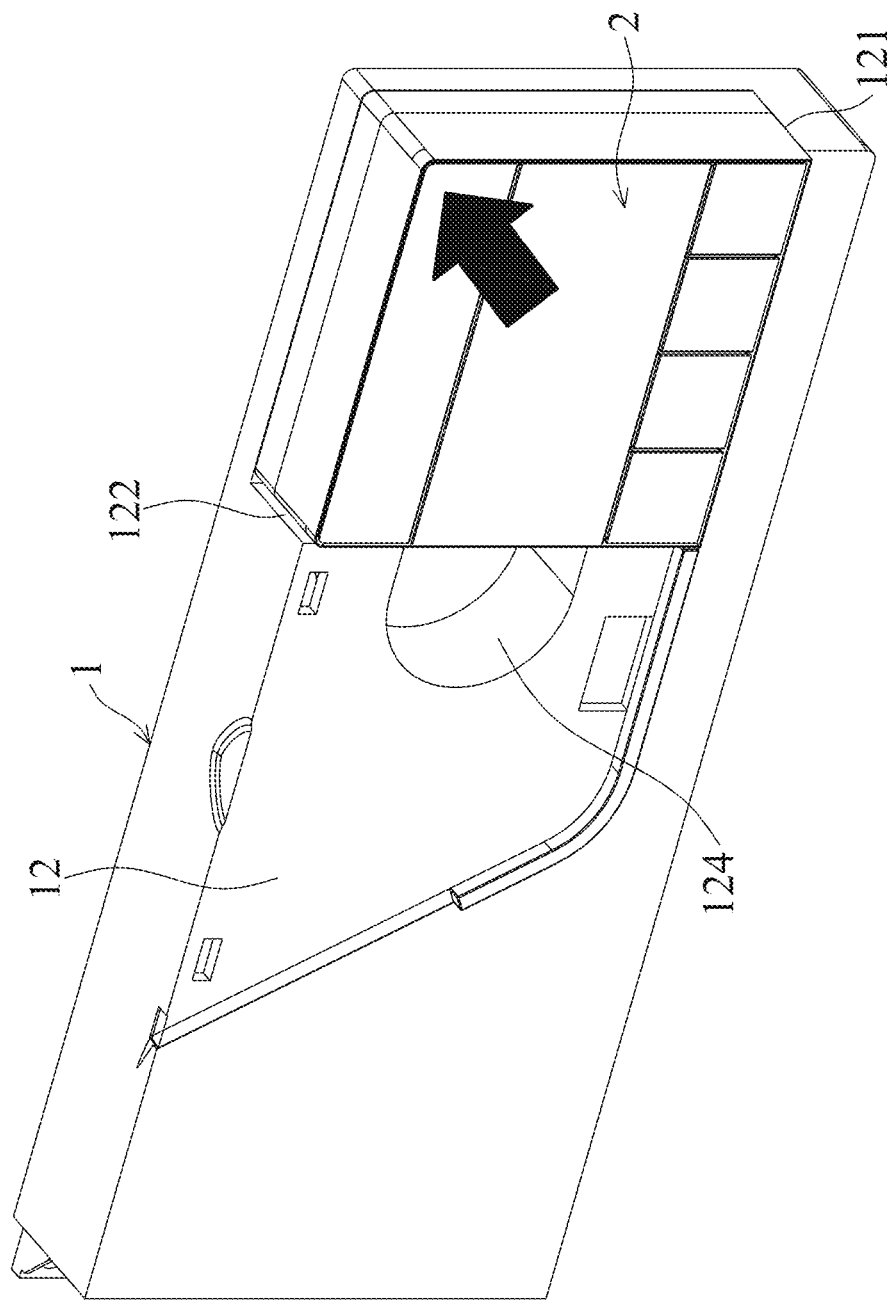
FIGS. 1A-1E show the operations of an electronic device with a display interface of the embodiment of the invention.
Figure 1B:
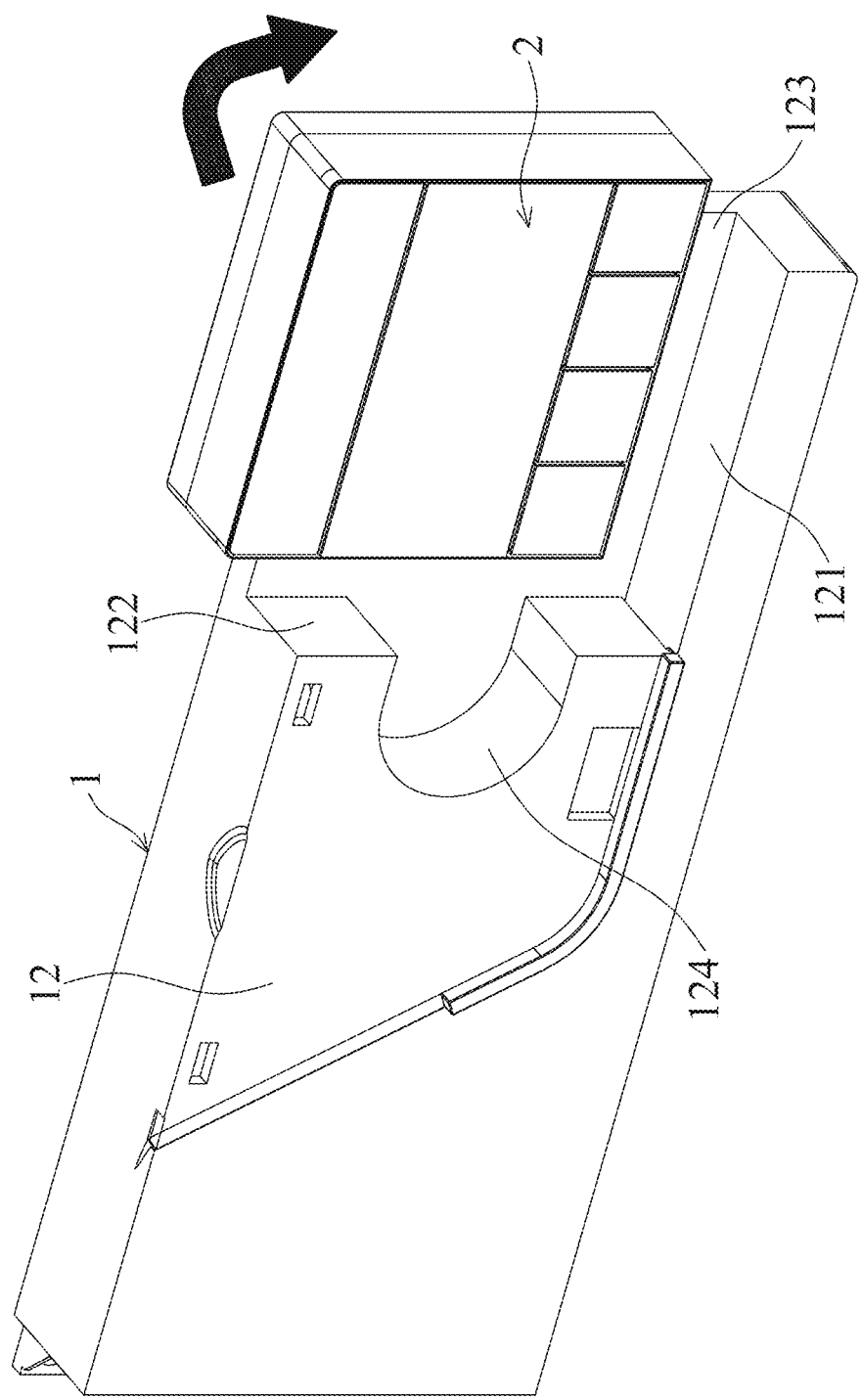
Figure 1C:
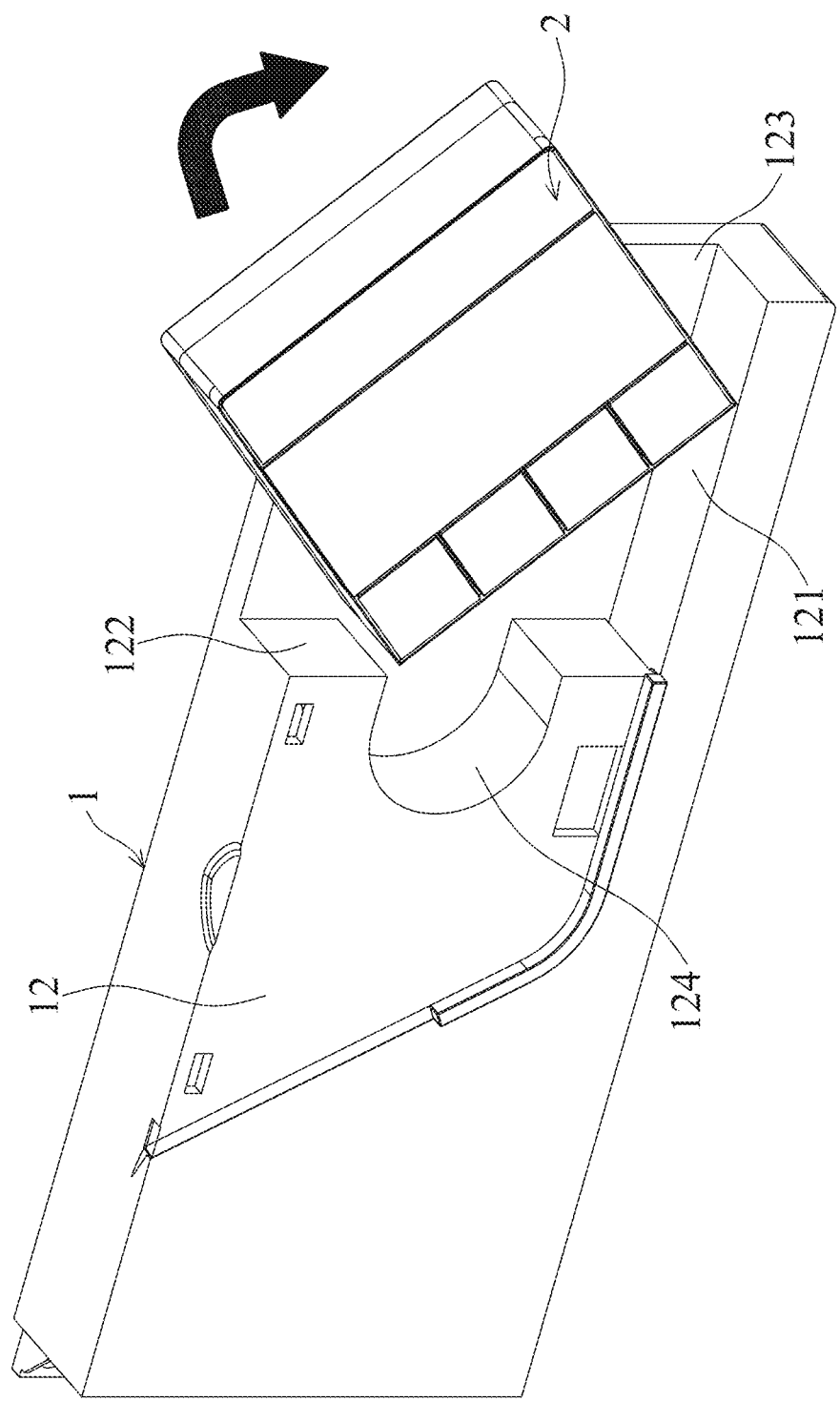
Figure 1D:
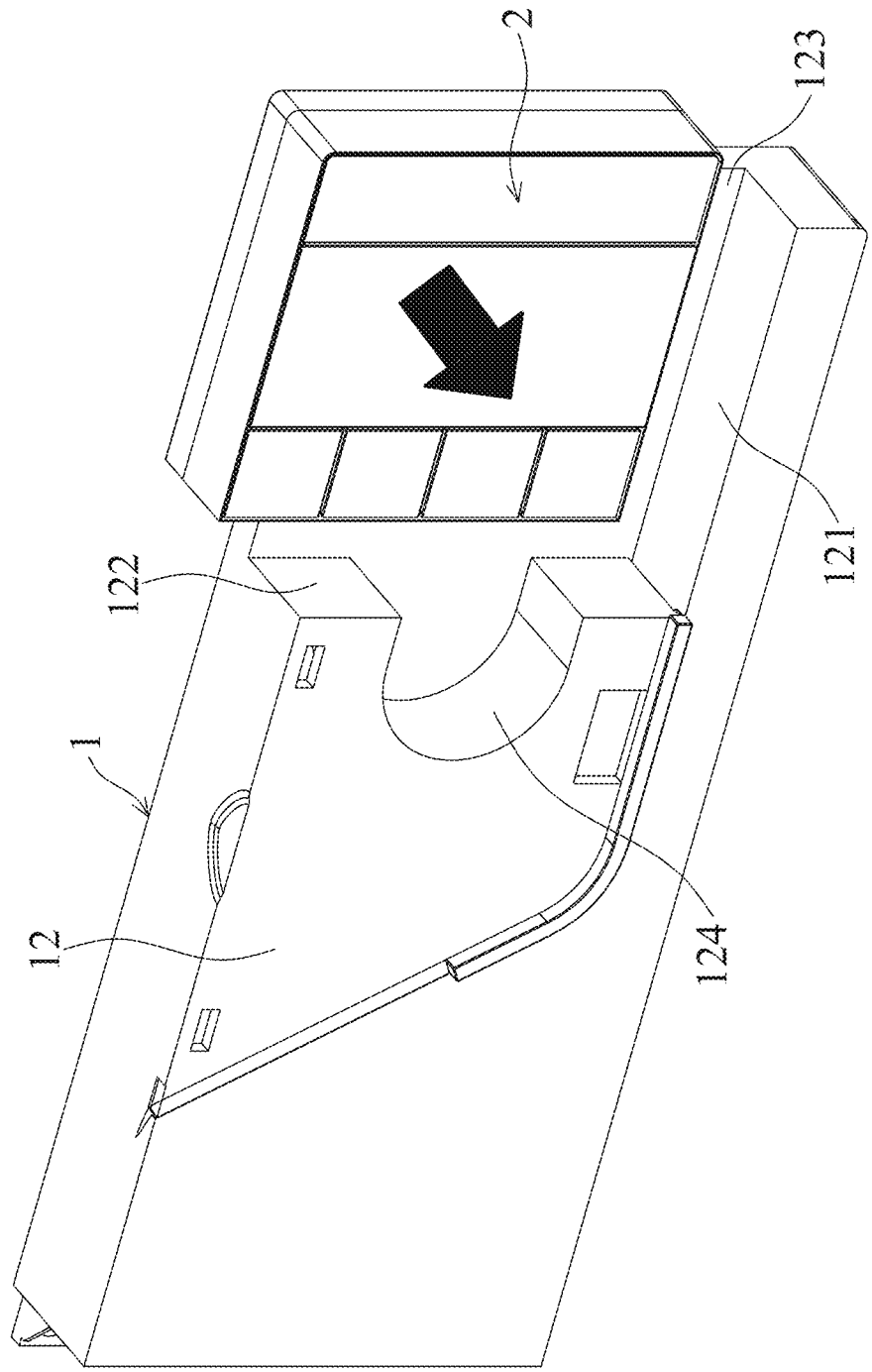
Figure 1E:
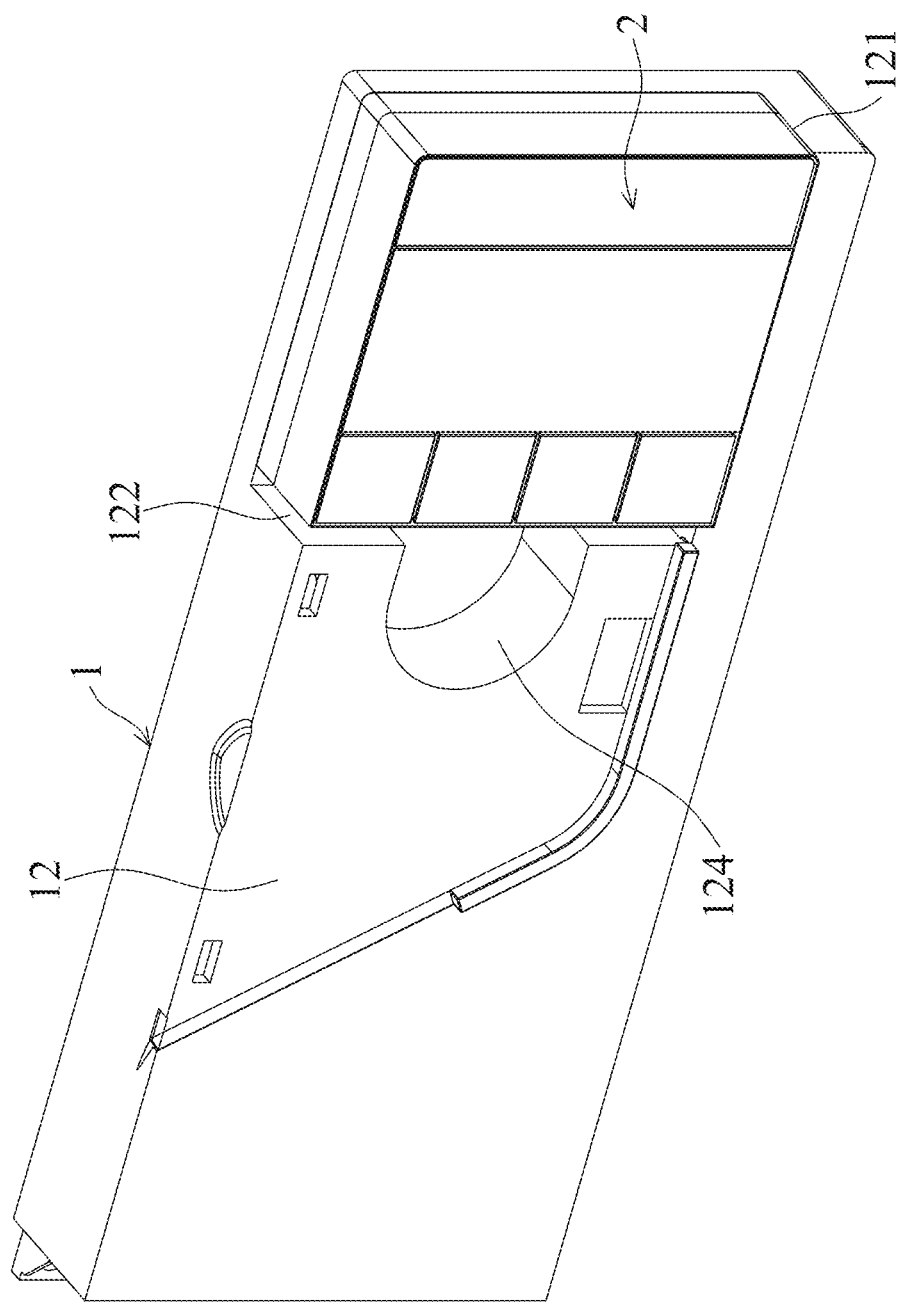

FIGS. 1A-1E show the operations of an electronic device with a display interface of the embodiment of the invention. With reference to FIGS. 1A-1E, the electronic device E of the embodiment of the invention includes a device body 1 and a display module 2. The display module 2 can be slid and rotated relative to the device body 1. The display module 2 can be rotated between the first module orientation (FIG. 1A) and the second module orientation (FIG. 1E). No matter the electronic device E is in a lying state or in a standing state, the user can easily read the information shown on the display module 2.

Figure 2A:
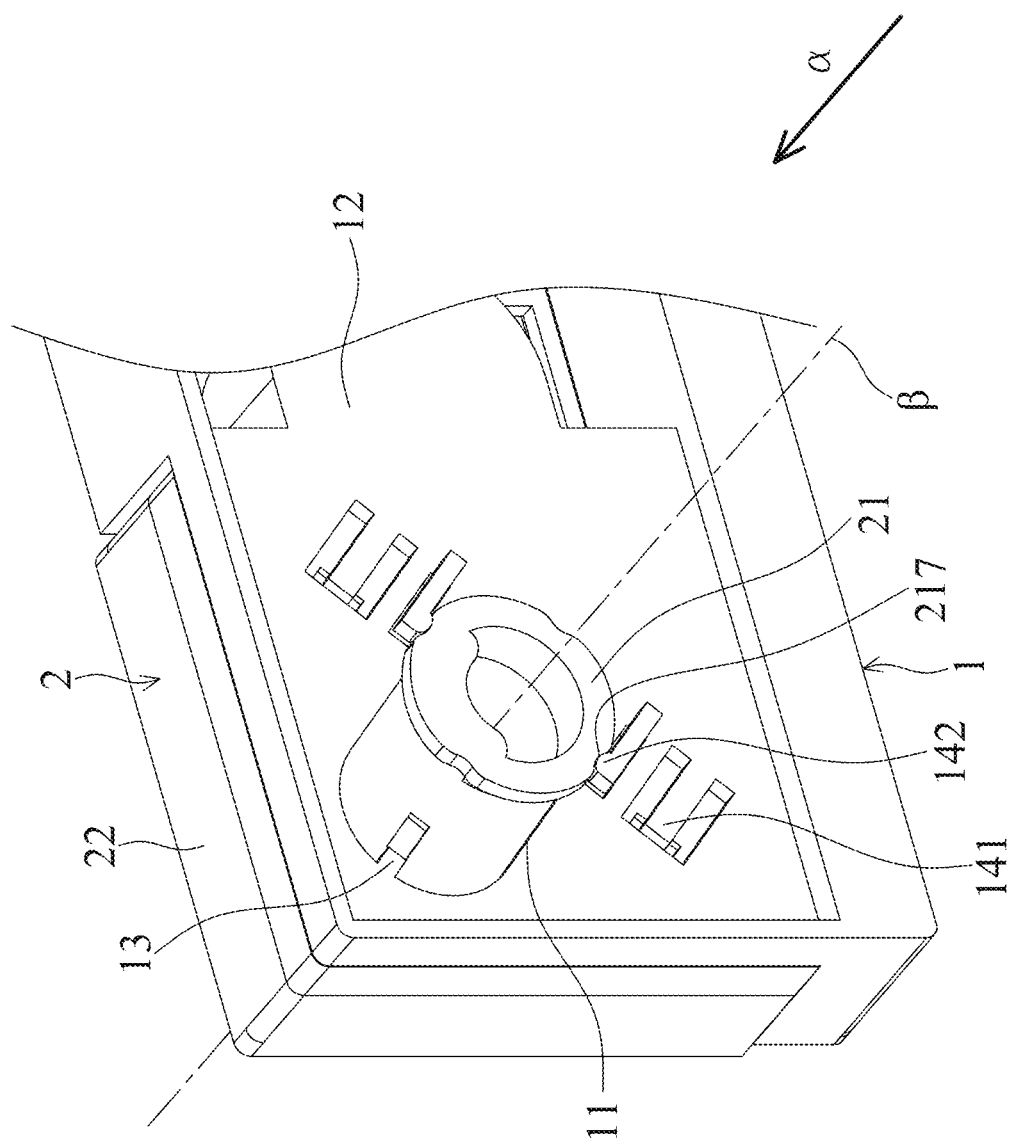
FIG. 2A shows the details of the electronic device of a first embodiment of the invention, wherein a shaft is in a first groove position of a groove.
Figure 2B:
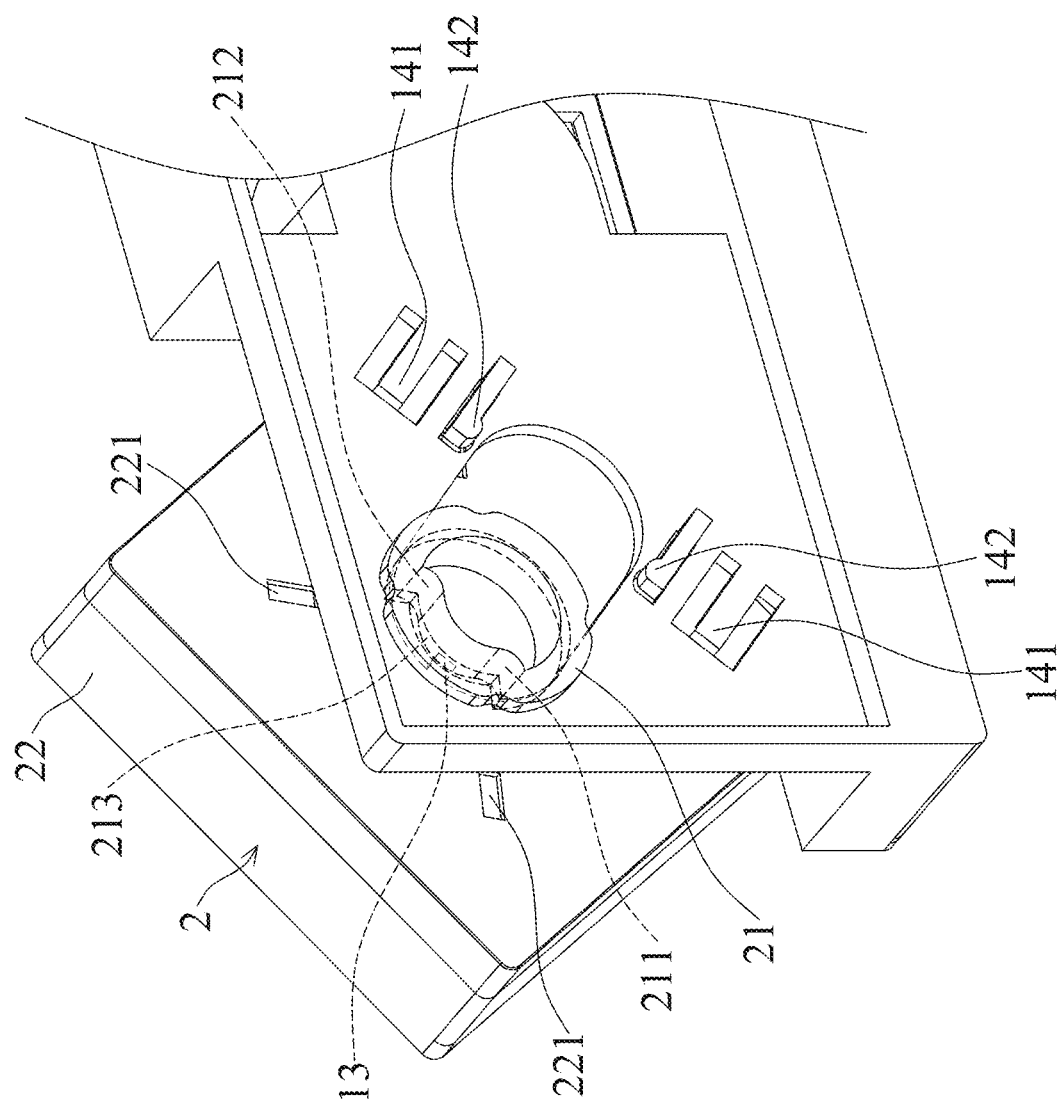
FIG. 2B shows the details of the electronic device of the first embodiment of the invention, wherein the shaft is in a second groove position of the groove.

FIGS. 2A and 2B show the details of the electronic device of a first embodiment of the invention. With reference to FIGS. 2A and 2B, in one embodiment, the device body 1 includes a groove 11. The display module 2 is disposed on the device body 1. The display module 2 comprises a shaft 21. The shaft 21 is rotatably connected to the groove 11, and is adapted to be slid in the groove 11. The display module 2 pivots on the device body 1 via the shaft 21. An extension direction α of the groove 11 differs from an axis β of the shaft 21.

In one embodiment, the extension direction α of the groove 11 is perpendicular to the axis β of the shaft 21.

With reference to FIGS. 2A and 2B, in one embodiment, the shaft 21 is slid between a first groove portion (FIG. 2A) and a second groove position (FIG. 2B) inside the groove 11. When the shaft 21 is in the first groove position (FIG. 2A), the orientation of the display module 2 relative to the device body 1 is restricted. When the shaft 21 is in the second groove position (FIG. 2B), the display module 2 is adapted to be rotated relative to the device body 1 (As shown in FIGS. 1B, 1C and 1D).

With reference to FIGS. 1A-1E, in one embodiment, the device body 1 comprises a cover 12. The groove 11 is formed on the cover 12. The cover 12 comprises a first cover wall 121. When the shaft 21 is in the first groove position (FIGS. 1A and 1E), the first cover wall 121 abuts the display module 2. When the shaft 21 is in the second groove portion, the first cover wall 121 is separated from the display module 2 (FIGS. 1B, 1C and 1D).

With reference to FIGS. 1A-1E, in one embodiment, the cover 12 comprises a receiving portion 123. The receiving portion 123 is located in a corner of the cover 12. The groove 11 is formed in the receiving portion 123. When the shaft 21 is in the first groove position (FIGS. 1A and 1E), the display module 2 sufficiently located in the receiving portion 123. When the shaft 21 is in the second groove position (FIGS. 1B, 1C an 1D), at least a portion of the display module 2 is located outside the receiving portion 123.

With reference to FIGS. 1A-1E, in one embodiment, the cover 12 further comprises a second cover wall 122. The second cover wall 122 is perpendicular to the first cover wall 121. A wall notch 124 is formed on the second cover wall 122. The wall notch 124 corresponds to one side of the display module 2. Therefore, the finger of the user can insert into the wall notch 124 and push the display module 2.

With reference to FIGS. 2A and 2B, in one embodiment, the shaft 21 is adapted to abut the inner wall of the groove 11, and is slid along the groove 11.

With reference to FIGS. 2A and 2B, in one embodiment, the shaft 21 comprises a shaft restriction slot 213. The shaft restriction slot 213 comprises a first stopping wall 211 and a second stopping wall 212. The device body 1 comprises a device stopping protrusion 13. When the shaft 21 is in the second groove position, the device stopping protrusion 13 is inserted into the shaft restriction slot 213. When the shaft 21 is in the second groove position and the display module 2 is in the first module orientation, the device stopping protrusion 13 abuts the first stopping wall 211. When the shaft 21 is in the second groove position and the display module 2 is in the second module orientation, the device stopping protrusion 13 abuts the second stopping wall 212. In the embodiment of the invention, the rotational range of the display module 2 is restricted.

Figure 2C:
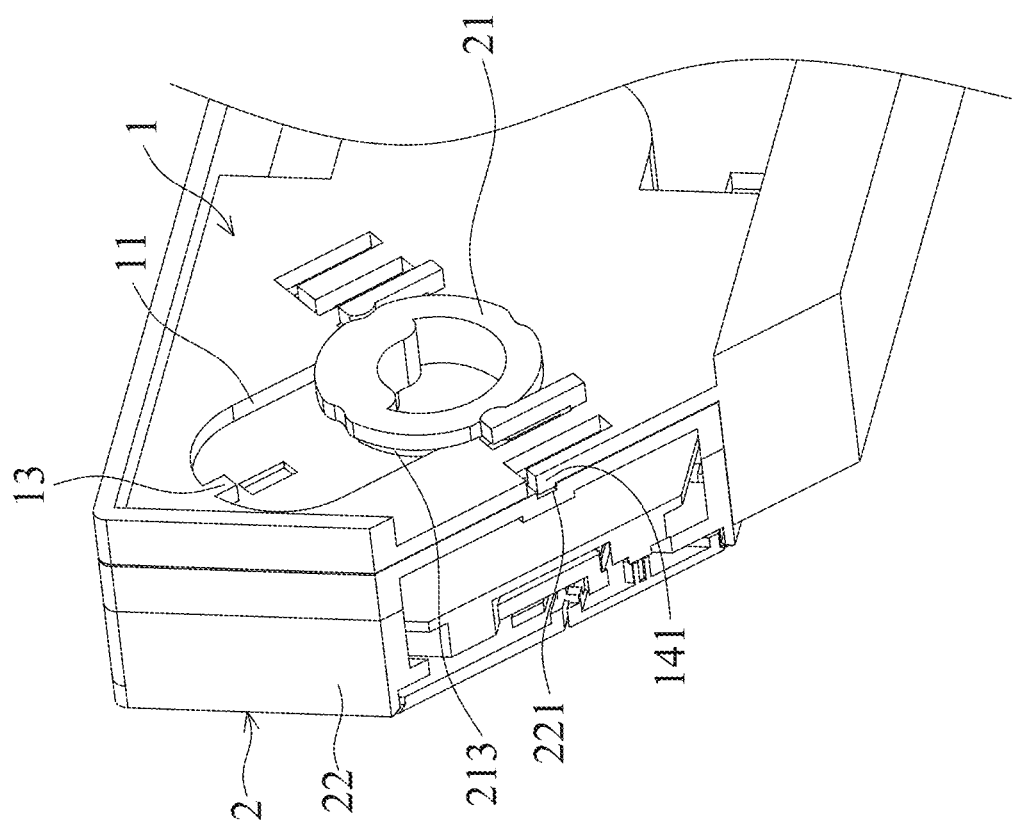
FIG. 2C shows a module wedging portion and a device wedging portion of the first embodiment of the invention.

FIG. 2C shows a module wedging portion and a device wedging portion of the first embodiment of the invention. With reference to FIGS. 2A, 2B and 2C, in one embodiment, the display module 2 comprises a module body 22. The shaft 21 is connected to the module body 22. The module body 22 comprises at least one module wedging portion 221. The device body 1 comprises at least one device wedging portion 141. When the shaft 21 is in the first groove position in the groove 11, the module wedging portion 221 is wedged into the device wedging portion 141 to restrict the orientation of the display module 2. When the shaft 21 is in the second groove position in the groove 11, the module wedging portion 221 is separated from the device wedging portion 141.

With reference to FIGS. 2A, 2B and 2C, in one embodiment, the device wedging portion 141 comprises a wedging arm (141), and the extension direction of the wedging arm (141) is parallel to the extension direction α of the groove 11.

With reference to FIGS. 2A, 2B and 2C, in one embodiment, the device body 1 comprises a plurality of device wedging portions 141, and the device wedging portions 141 are disposed on both sides of the groove 11.

In one embodiment, the shaft 21 further comprises a plurality of shaft restriction notches 217. The device body 1 comprises at least one device restriction hook 142. When the shaft 21 is in the first groove position in the groove 11 and the display module 2 is in the first module orientation, the device restriction hook 142 wedges one of the shaft restriction notches 217. When the shaft 21 is in the first groove position in the groove 11 and the display module 2 is in the second module orientation, the device restriction hook 142 wedges another shaft restriction notches 217, and the orientation of the display module 2 is therefore restricted.

Figure 3A:
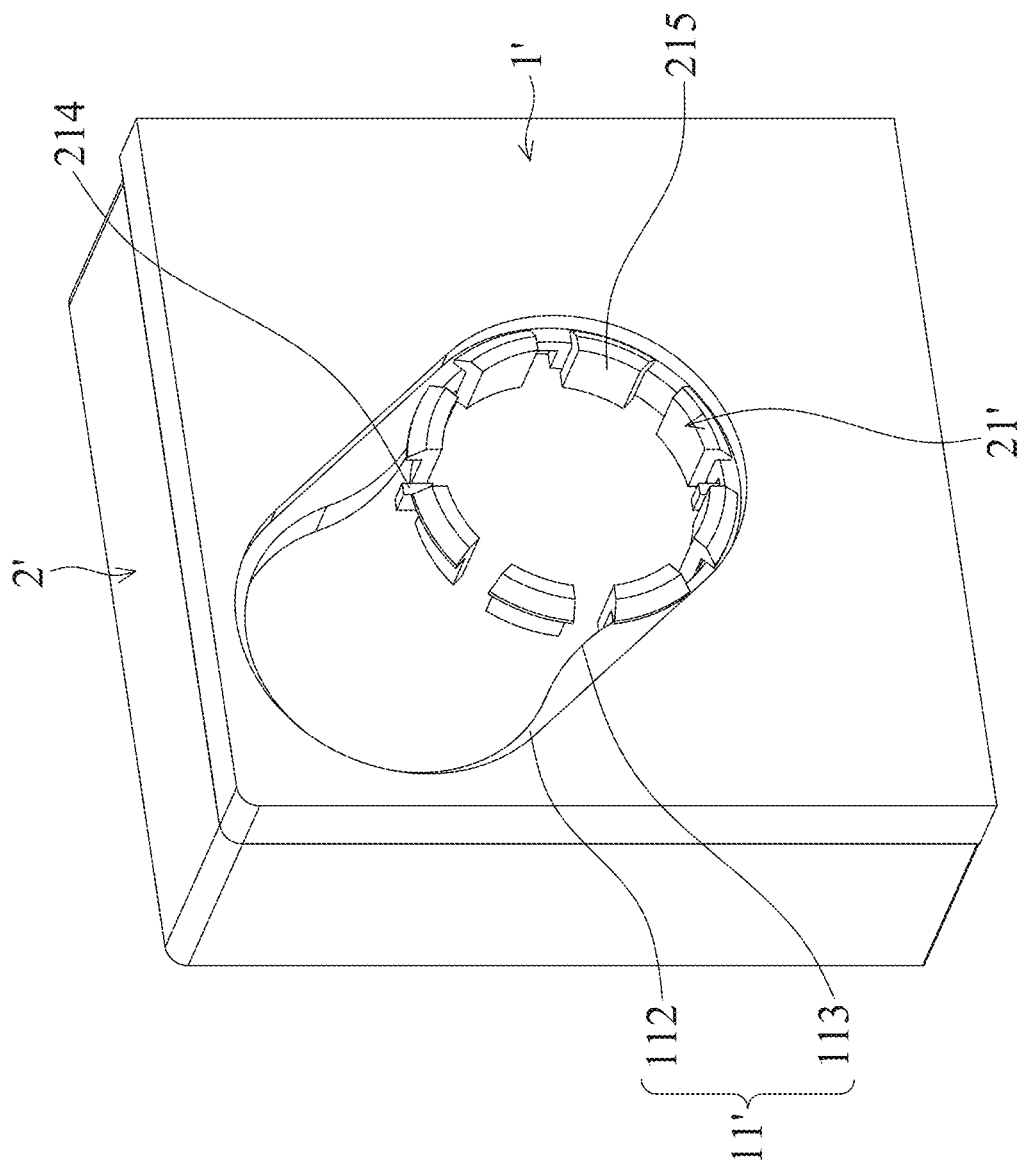
FIG. 3A shows the details of the electronic device of a second embodiment of the invention, wherein the shaft is in the first groove position of the groove.
Figure 3B:
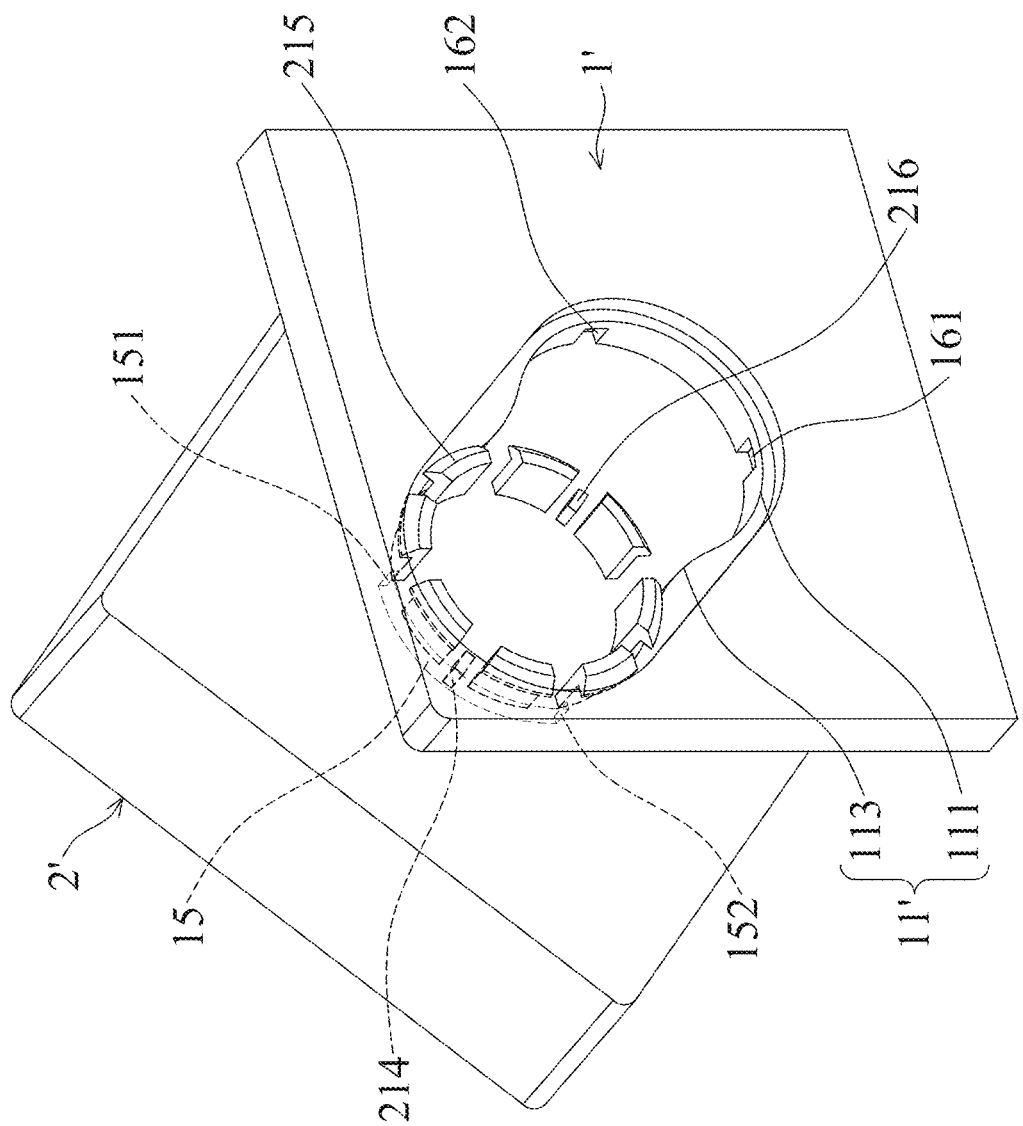
FIG. 3B shows the details of the electronic device of the second embodiment of the invention, wherein the shaft is in the second groove position of the groove.

FIGS. 3A and 3B show the details of the electronic device of a second embodiment of the invention. With reference to FIGS. 3A and 3B, in one embodiment, the shaft 21' comprises a first shaft stopping protrusion 214. The device body 1' comprises a device restriction slot 15. The device restriction slot 15 comprises a third stopping wall 151 and a fourth stopping wall 152. When the shaft 21' is in the second groove position (FIG. 3B), the first shaft stopping protrusion 214 is inserted into the device restriction slot 15. When the shaft 21' is in the second groove position, and the display module 2' is in the first module orientation, the first shaft stopping protrusion 214 abuts the third stopping wall 151. When the shaft 21' is in the second groove position, and the display module 2 is in the second module orientation, the first shaft stopping protrusion 214 abuts the fourth stopping wall 152. Utilizing the embodiment of the invention, the orientation of the display module 2 is therefore restricted.

With reference to FIGS. 3A and 3B, in one embodiment, the shaft 21' comprises a plurality of flexible fasteners 215. The flexible fasteners 215 are arranged in an annular manner. The flexible fasteners 215 are wedged into the device body 1'. The groove 11' comprises a first groove area 111, a second groove area 112 and a waist area 113. The waist area 113 is located between the first groove area 111 and the second groove area 112. The width of the waist area 113 is smaller than the width of the first groove area 111. The width of the waist area 113 is smaller than the width of the second groove area 112. When the shaft 21' is in the first groove position (FIG. 3A), the shaft 21' is in the first groove area 111. When the shaft 21' is in the second groove position (FIG. 3B), the shaft 21' is in the second groove area 112. Utilizing the flexible fasteners 215 and the waist area 113, the shaft 21' can stably stay in the first groove area 111 or the second groove area 112.

With reference to FIGS. 3A and 3B, in one embodiment, the device body comprises at least one restriction slot 161. The shaft 21' comprises a second shaft stopping protrusion 216. When the shaft 21' is in the first groove position, the second shaft stopping protrusion 216 wedges one of the restriction slot 161 to restrict the orientation of the display module 2.

In one embodiment, the electronic device can be an uninterruptible power system, and the display module shows the power-capacitance information and voltage information.

Utilizing the electronic device of the embodiment of the invention, the display module can be rotated relative to the device body. The shaft of the embodiment of the invention has simpler structure and occupies smaller space. The display module is coupled to a mainboard of the electronic device via a cable. The length of the cable can be reduced, and the cable is prevented from being unexpectedly detached from the display module.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device with a display interface, comprising:
   a device body, comprising a groove;
   a display module, disposed on the device body, wherein the display module comprises a shaft, the shaft is rotatably connected to the groove, and is adapted to be slid in the groove, and an extension direction of the groove differs from an axis of the shaft,
   wherein the extension direction of the groove is perpendicular to the axis of the shaft,
   wherein the shaft is slid between a first groove position and a second groove position inside the groove, and when the shaft is in the first groove position, an orientation of the display module relative to the device body is restricted, and when the shaft is in the second groove position, the display module is adapted to be rotated relative to the device body,
   wherein the shaft comprises a plurality of flexible fasteners, the flexible fasteners are arranged in an annular manner, the flexible fasteners are wedged into the device body, the groove comprises a first groove area, a second groove area and a waist area, the waist area is located between the first groove area and the second groove area, a width of the waist area is smaller than a width of the first groove area, the width of the waist area is smaller than a width of the second groove area, and when the shaft is in the first groove position, the shaft is in the first groove area, and when the shaft is in the second groove position, the shaft is in the second groove area.

2. The electronic device as claimed in claim 1, wherein the device body comprises a cover, the groove is formed on the cover, the cover comprises a first cover wall, and when the shaft is in the first groove position, the first cover wall abuts the display module, and when the shaft is in the second groove position, the first cover wall is separated from the display module.

3. The electronic device as claimed in claim 2, wherein the cover comprises a receiving portion, the receiving portion is located in a corner of the cover, the groove is formed in the receiving portion, and when the shaft is in the first groove position, the display module is sufficiently located in the receiving portion, and when the shaft is in the second groove position, at least a portion of the display module is located outside the receiving portion.

4. The electronic device as claimed in claim 3, wherein the cover further comprises a second cover wall, the second cover wall is perpendicular to the first cover wall, a wall notch is formed on the second cover wall, and the wall notch corresponds to one side of the display module.

5. The electronic device as claimed in claim 1, wherein the shaft is adapted to abut an inner wall of the groove.

6. The electronic device as claimed in claim 1, wherein the device body comprises at least one restriction slot, the shaft comprises a second shaft stopping protrusion, and when the shaft is in the first groove position, the second shaft stopping protrusion wedges one of the restriction slots to restrict the orientation of the display module.

7. The electronic device as claimed in claim 1, wherein the display module shows power-capacitance information and voltage information.

\* \* \* \* \*